US008008837B2

(12) United States Patent
Fukano et al.

(10) Patent No.: US 8,008,837 B2
(45) Date of Patent: Aug. 30, 2011

(54) SURFACE ACOUSTIC WAVE DEVICE AND METHOD OF MANUFACTURING THE SAME

(75) Inventors: Toru Fukano, Kyoto (JP); Atsuomi Fukuura, Kyoto (JP)

(73) Assignee: Kyocera Corporation, Kyoto (JP)

( * ) Notice: Subject to any disclaimer, the term of this patent is extended or adjusted under 35 U.S.C. 154(b) by 48 days.

(21) Appl. No.: 12/521,554

(22) PCT Filed: Dec. 28, 2007

(86) PCT No.: PCT/JP2007/075289
§ 371 (c)(1),
(2), (4) Date: Jun. 26, 2009

(87) PCT Pub. No.: WO2008/081935
PCT Pub. Date: Jul. 10, 2008

(65) Prior Publication Data
US 2010/0277037 A1    Nov. 4, 2010

(51) Int. Cl.
*H03H 9/25* (2006.01)
(52) U.S. Cl. .................... 310/313 B; 310/340; 310/344; 29/25.35
(58) Field of Classification Search ............. 310/313 B, 310/313 R, 340, 344; 29/25.35
See application file for complete search history.

(56) References Cited

U.S. PATENT DOCUMENTS

| 2002/0101304 A1 | 8/2002 | Onishi et al. ................. 333/193 |
| 2006/0234159 A1 | 10/2006 | Yamaguchi ................ 430/270.1 |
| 2009/0124776 A1 | 5/2009 | Takai |
| 2010/0019867 A1* | 1/2010 | Tsuda .......................... 333/193 |
| 2010/0244625 A1* | 9/2010 | Fukano et al. ............. 310/313 B |

FOREIGN PATENT DOCUMENTS

| JP | 09-246905 | 9/1997 |
| JP | 10-112624 | 4/1998 |
| JP | 10-270975 | 10/1998 |

(Continued)

OTHER PUBLICATIONS

Japanese language office action dated Feb. 22, 2011 and its English language translation for corresponding Japanese application 2008552186.

(Continued)

*Primary Examiner* — Thomas M Dougherty
(74) *Attorney, Agent, or Firm* — DLA Piper LLP (US)

(57) ABSTRACT

A surface acoustic wave device excellent in reliability and a method of manufacturing the same are provided. The surface acoustic wave device comprises a piezoelectric substrate (1) for propagating an surface acoustic wave thereon, an IDT (2) formed on a first main surface of the piezoelectric substrate (1) and a protective cover (6) formed of a photocurable material and covering a formation region of the IDT (2), thereby forming a hollow containing space (7) together with the first main surface, which has an acid generating portion containing an acid-generating agent in a region at its lower end. The surface acoustic wave device further comprises a connecting line (3) formed on the first main surface and connected to the IDT (2), being drawn out from the inside of the protective cover (6) to the outside thereof to have an end portion at the outside of the protective cover (6), and a bonding film (8) formed of an insulating material and so formed as to be interposed at least between the acid generating portion of the protective cover (6) and the connecting line (3).

11 Claims, 6 Drawing Sheets

FOREIGN PATENT DOCUMENTS

| | | |
|---|---|---|
| JP | 2000-261284 | 9/2000 |
| JP | 2001181498 A | 7/2001 |
| JP | 2002-261582 | 9/2002 |
| JP | 2004153412 A | 5/2004 |
| JP | 2004235908 A | 8/2004 |
| JP | 2005-341162 | 12/2005 |
| JP | 2005341162 A | 12/2005 |
| JP | 2006-321984 | 11/2006 |
| WO | 2006059564 A1 | 6/2006 |

OTHER PUBLICATIONS

Japanese language office action dated Feb. 22, 2011 and its English language translation for corresponding Japanese application 2008552186 cites the foreign patent documents above.

* cited by examiner (a)

(b)

(a)

(b)

(c)

(d)

(e)

F I G . 7
(a)
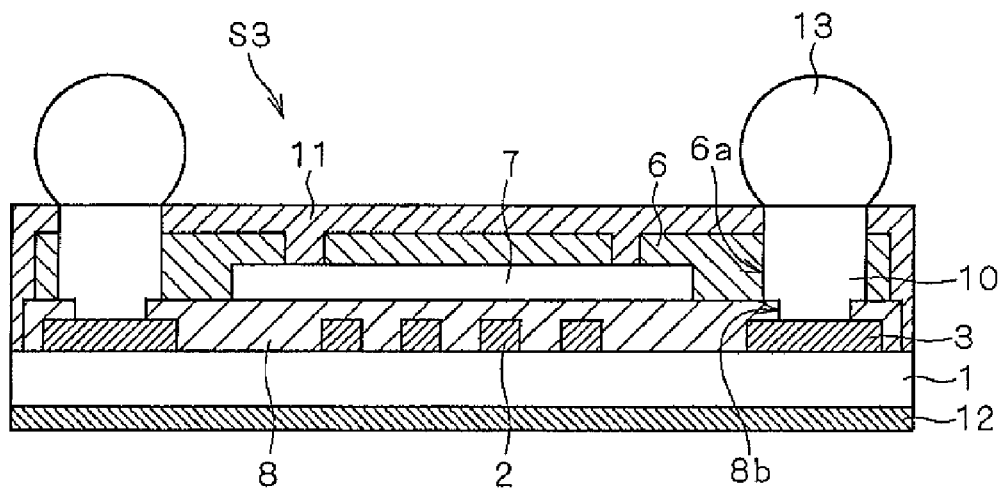
(b)
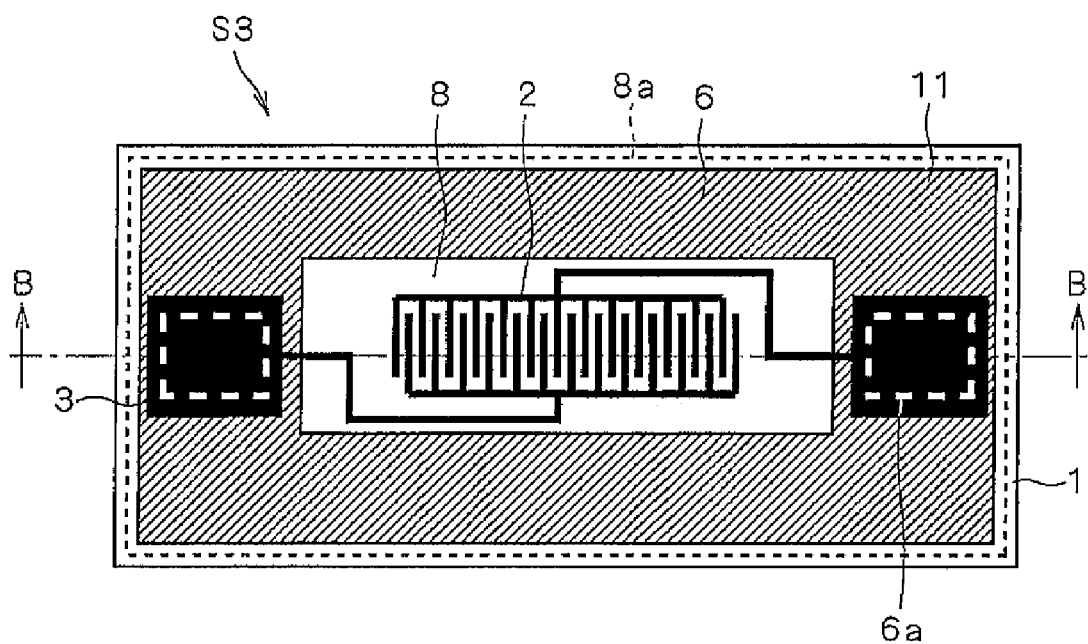

SURFACE ACOUSTIC WAVE DEVICE AND METHOD OF MANUFACTURING THE SAME

CROSS-REFERENCE TO THE RELATED APPLICATIONS

This application is a national stage of international application No. PCT/JP2007/075289 filed Dec. 28, 2007, which also claims the benefit of Priority under 35 USC 119 to Japanese Patent Application No. 2006-354039 filed on Dec. 28, 2006, the entire contents of which are incorporated herein by reference.

TECHNICAL FIELD

The present invention relates to a surface acoustic wave device which is mainly used in a wireless communication circuit of a mobile communication equipment and the like and a method of manufacturing the same.

BACKGROUND ART

In recent years, portable terminal devices used for mobile communication have been made smaller and lighter, and as they have been made multiband and multifunctional to cope with a plurality of communication systems, the number of circuits incorporated therein increases. For this reason, it is strongly desired that electronic components to be used therein should be made surface-mountable and smaller in order to increase packaging density.

One of key parts of the portable terminal devices is a surface acoustic wave device. The surface acoustic wave device usually has a construction in which a sealed hollow portion serving as a vibration space is provided in vicinity of an electrode surface exciting a surface acoustic wave. Also for such a surface acoustic wave device, it is required to be made surface-mountable and smaller.

DISCLOSURE OF INVENTION

The present invention is intended to solve the above problem, and it is an object of the present invention to provide a surface acoustic wave device excellent in reliability and a method of manufacturing the same.

In order to solve the above problem, according to a first aspect of the present invention, the surface acoustic wave device comprises a piezoelectric substrate for propagating an surface acoustic wave thereon, an IDT formed on a first main surface of the piezoelectric substrate and comprising at least one comb-like electrode consisting of a plurality of electrode fingers each having a longitudinal direction orthogonal to a propagating direction of the surface acoustic wave, a protective cover formed of a photocurable material and covering a formation region of the IDT, thereby forming a hollow containing space together with the first main surface, which has an acid generating portion containing an acid-generating agent in a region at its lower end, a connecting line formed on the first main surface and connected to the IDT, being drawn out from the containing space to the outside of the containing space separated by the protective cover, to have an end portion at the outside of the protective cover, and a bonding film formed of an insulating material and so formed as to be interposed at least between the acid generating portion of the protective cover and the connecting line.

By the present invention, it is possible to achieve a surface acoustic wave device excellent in long-term reliability.

BRIEF DESCRIPTION OF DRAWINGS

FIG. 1(a) is a cross section of the surface acoustic wave device S1, and FIG. 1(b) is a view showing a two-dimensional arrangement relation of constituent elements of the surface acoustic wave device S1;

[FIG. 7] is a view showing a variation of the surface acoustic wave devices in accordance with the first and second preferred embodiments. FIG. 7(a) is a cross section of a surface acoustic wave device S3, and FIG. 7(b) is a view showing a two-dimensional arrangement relation of constituent elements of the surface acoustic wave device S3.

BEST MODE FOR CARRYING OUT THE INVENTION

The First Preferred Embodiment

<Constitution of Surface Acoustic Wave Device>

Figure 1:
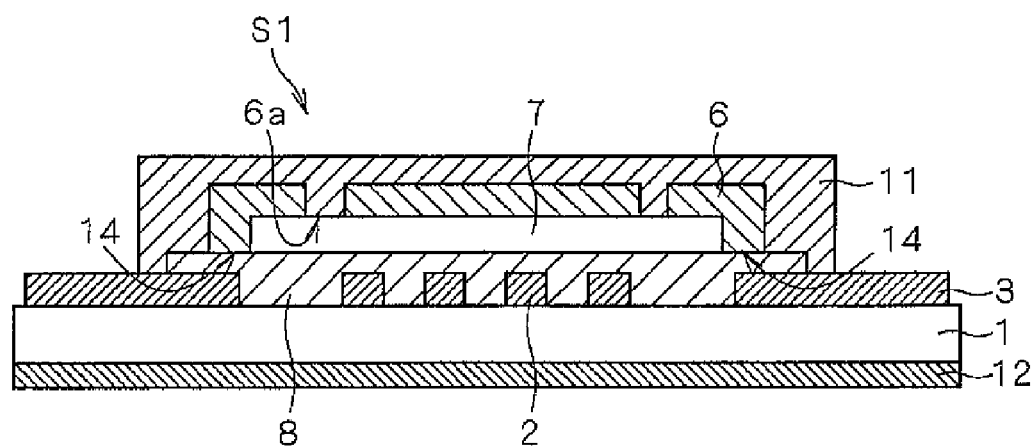
[FIG. 1] is a schematic view showing a surface acoustic wave device S1 in accordance with a first preferred embodiment.
Figure 1:
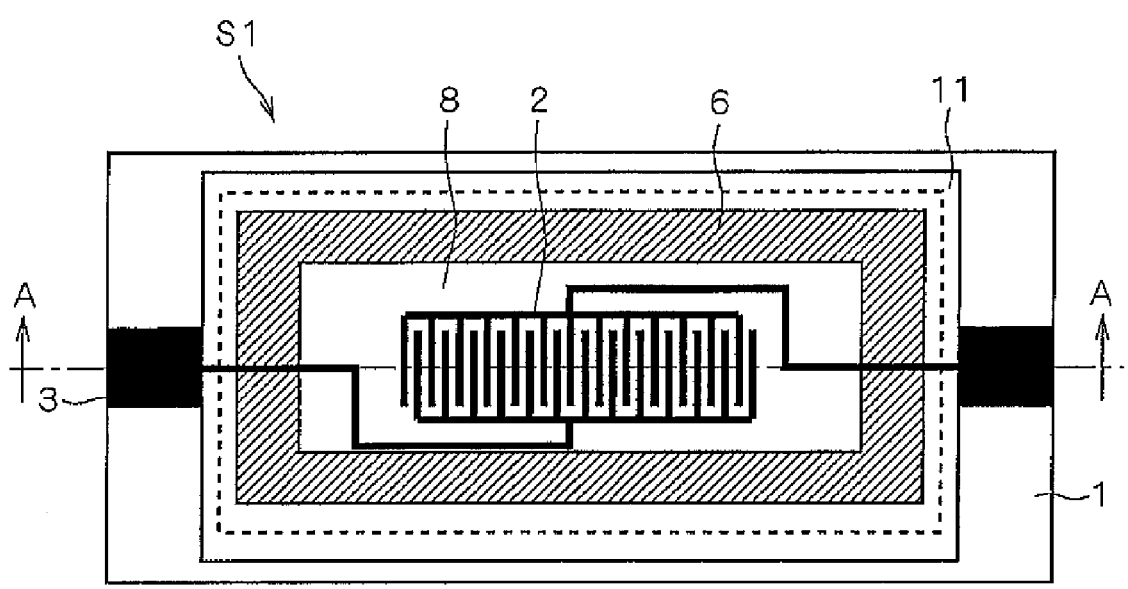

FIG. 1 is a schematic view showing a surface acoustic wave device S1 in accordance with the first preferred embodiment of the present invention. The A-A cross section shown in FIG. 1(b) substantially corresponds to the cross section shown in FIG. 1(a). Specific sizes of constituent elements and arrangement intervals thereof, however, are not necessarily limited to those shown in FIG. 1. Further, FIG. 1(b) is a view to facilitate the understanding on the arrangement relation, and a plan view of the surface acoustic wave device SI is not necessarily such as shown in FIG. 1(b).

The surface acoustic wave device S1 in accordance with the first preferred embodiment mainly comprises a piezoelectric substrate 1, an IDT 2, a connecting line 3, a protective cover 6 and a bonding film 8, as shown in FIG. 1.

The piezoelectric substrate 1 is a piezoelectric single crystal substrate such as a lithium tantalate single crystal or a lithium niobate single crystal.

The IDT 2 is formed on a first main surface of the piezoelectric substrate 1 (an upper surface in the cross section shown in FIG. 1(a), and hereinafter, referred to simply as an "upper surface") and constituted of a pair of or a plurality of pairs of comb-like electrodes each provided with a plurality of electrode fingers whose longitudinal direction is orthogonal to an surface acoustic wave propagating direction of the piezoelectric substrate 1. The comb-like electrode consists of the electrode fingers which are engaged with one another. For convenience of illustration, the number of comb-like electrodes is different between FIGS. 1(a) and 1(b). The IDT 2 is formed of an Al alloy such as an Al—Cu alloy. In order to achieve desired characteristics, a ladder-type surface acoustic wave filter and the like may be formed by connecting a plurality of IDTs 2 in series, in parallel or the like. At both ends of the IDT 2, reflectors are provided, each of which has a comb-like electrode consisting of a plurality of electrode fingers whose longitudinal direction is orthogonal to the surface acoustic wave propagating direction of the piezoelectric substrate 1, same as the IDT 2. Since its detailed construction does not directly relate to a characteristic feature of this preferred embodiment, however, the element including the reflectors is referred to as the "IDT 2" for simple discussion in this preferred embodiment.

The connecting line 3 is a signal line formed on the piezoelectric substrate 1, for connecting the IDT 2 to an external circuit. The connecting line 3 is formed of an Al alloy such as an Al—Cu alloy. In the cross section of FIG. 1(a), though the IDT 2 is shown so that a section orthogonal to the longitudinal direction of the IDT 2 may be shown (so that a direction orthogonal to this figure may coincide with the longitudinal direction of the electrode fingers) and the connecting line 3 is shown so that its section may be shown, the arrangement relation of the IDT 2 and the connecting line 3 of the surface acoustic wave device S1 is not limited to this manner. Further, though FIG. 1 shows a case where the connecting line 3 is so provided as to reach a side end of the piezoelectric substrate 1, the arrangement of the connecting line 3 is not necessarily limited to this manner. Broadening of an end of the connecting line 3 which is not connected to the IDT 2 is preferable for easy connection with the external circuit.

Each of the IDT 2 and the connecting line 3 can be formed by patterning an Al-alloy film which is formed by thin film formation such as sputtering, vapor deposition or CVD (Chemical Vapor Deposition), into a desired shape by photolithography using a reduction projection aligner (stepper) and an RIE (Reactive Ion Etching) device and the like.

The protective cover 6 is a member which is constituted of a frame portion surrounding the IDT and a flat cover portion provided on the frame portion and so formed on the piezoelectric substrate 1 as to cover a formation region of the IDT 2, thereby forming a hollow containing space together with the piezoelectric substrate 1 for containing the IDT 2. In FIG. 1(b), a portion which corresponds to a lower end (of the frame portion) of the protective cover 6 is hatched. The containing space 7 is a space which is provided to serve as a vibration space for the electrode fingers of the IDT 2. For formation of the protective cover 6, naturally, used is a material to achieve a sufficient bond with the piezoelectric substrate 1. As a main material, a negative-type photocurable resist such as an epoxy resin, a polyimide resin, a BCB (benzocyclobutene) or an acrylic resin can be used.

As shown in FIG. 1, however, in the surface acoustic wave device S1 of the first preferred embodiment, an end portion of the connecting line 3 extends to the outside of the protective cover 6. In other words, part of the protective cover 6 is formed to straddle over the connecting line 3. Therefore, in a portion where the connecting line 3 is formed, on the connecting line 3, formed is a bonding film 8 which is a resin film formed of an insulating material such as silicon oxide, silicon nitride or silicon, and the protective cover 6 is formed further thereon. At least, of the lower end (of the frame portion) of the protective cover 6, a portion (referred to as an "arrangement surface 14") which is in contact with the bonding film 8 is an acid-generating portion. The acid-generating portion is a portion of the protective cover 6, which is formed by mixing an acid-generating agent into the above-discussed photosensitive resist. The acid-generating agent is a substance generating a proton ($H^+$) in response to light irradiation or heating. It is a preferable example to use e.g., triaryl sulfonium hexafluoroantimonate. Other than this, benzoin tosylate, benzoin mesylate, pyrogallol tritosylate, pyrogallol trimesylate, tri(nitrobenzyl) phosphate, trianisoin phosphate, diaryliodonium salt, triarylsulfonium salt and the like may be also used.

The acid-generating agent discussed above may be given not only to the arrangement surface 14 of the protective cover 6 but also to the whole of the photosensitive resist which is a constituting material for the protective cover 6.

As discussed above, by forming the bonding film 8 on the connecting line 3 and giving an acid-generating agent to the arrangement surface 14 of the protective cover 6 which is in contact therewith, it is possible to achieve a good bond even between the protective cover 6 and the connecting line 3 enough to ensure hermeticity of the containing space 7, in the surface acoustic wave device S1. This can suppress entrance of water, corrosive liquid solutions and the like into the protective cover 6. Further, since hardening proceeds also on the bottom surface side of the protective cover 6, the containing space 7 is stably maintained.

It is guessed that such a good bond can be achieved by a covalent bond occurring between atoms in a surface of the bonding film 8 and protons generated from the acid-generating agent. If silicon oxide ($SiO_2$) is used as the bonding film 8, for example, it is thought that the protons generated from the acid-generating agent of the arrangement surface 14 of the protective cover 6 breaks the bond of oxygen atoms of the resin material forming the protective cover 6 to cause ring opening, thereby forming a covalent bond with oxygen atoms of the Si—OH group of the $SiO_2$ surface, to achieve such a good bond. Further, it is also thought that the protons may accelerate formation of OH group on the $SiO_2$ surface.

From another viewpoint, the bonding film 8 has a function to prevent the arrangement surface 14 from coming into direct contact with the connecting line 3.

As indicated by a broken line in FIG. 1(b), it is preferable that an outer peripheral edge 8a of the bonding film 8 should be positioned outside an outer peripheral edge (of the frame portion) of the protective cover 6. Thus, by forming the bonding film 8 so that the outer peripheral edge 8a of the bonding film 8 may be positioned outside the outer peripheral edge of the protective cover 6, it is possible to efficiently prevent the arrangement surface 14 of the protective cover 6 from coming into contact with the connecting line 3. As a contact area between the bonding film 8 and a sealing resin layer 11 increases, the bonding strength between the bonding film 8 and the sealing resin layer 11 increases and this advantageously further increases the hermeticity of the containing space 7.

The protective cover 6 is provided with a through hole 6a from the necessity in the manufacturing process for the surface acoustic wave device S1 discussed later, but since the through hole 6a is sealed by the sealing resin layer 11, the hermeticity of the containing space 7 is ensured.

FIG. 1 shows a case where the bonding film 8 is so provided, extending to a region where the IDT 2 is formed, as to cover the IDT 2 (as to bury the IDT 2), instead of a case where the bonding film 8 exists only between the connecting line 3 and the protective cover 6. In this case, the bonding film 8 serves as a protection film for protecting the IDT 2.

Even in the case where the bonding film 8 is provided only between the connecting line 3 and the protective cover 6, the part on the connecting line 3 also has an effect of ensuring the hermeticity with the protective cover 6. Moreover, in the case shown in FIG. I, the hermeticity of the containing space 7 further increases. An effect of suppressing any change of frequency-temperature characteristics of the surface acoustic wave device Si can be also achieved. Further, by adjusting the thickness of the bonding film 8 as appropriate, it becomes possible to control frequency-characteristics of the surface acoustic wave device S1 as appropriate.

In the surface acoustic wave device S1, the sealing resin layer 11 is so formed as to cover the protective cover 6 and seal the through hole 6a. It is preferable that the sealing resin layer 11 is formed by an epoxy resin, whose thermal expansion coefficient is adjusted to be almost equal to that of the piezoelectric substrate 1 by mixing a filler, and having excellent chemical resistance, or is formed by one of the other materials having low modulus of elasticity. This is because a stress to be imposed on the piezoelectric substrate 1 can be suppressed as much as possible.

The sealing resin layer 11, however, may be formed after formation of an external connection electrode on the connecting line 3 as discussed later.

In the surface acoustic wave device S1, entirely on a main surface of the piezoelectric substrate 1 (a lower surface in the cross section shown in FIG. 1, and hereinafter, referred to simply as a "lower surface") on the opposite side of the main surface on which the IDT 2 is formed, a back surface electrode 12 is further provided. The back surface electrode 12 is formed of an Al alloy such as an. Al—Cu alloy. Since electric charges accumulated on the surface of the piezoelectric substrate 1 due to a temperature change can be grounded by providing the back surface electrode 12, it is possible to prevent the piezoelectric substrate 1 from being broken by a spark or the like and prevent the spark from occurring among the electrode fingers of the IDT 2, and the like. The back surface electrode 12 is formed by thin film formation such as sputtering, vapor deposition or CVD (Chemical Vapor Deposition).

As discussed above, in the surface acoustic wave device of the first preferred embodiment, it is possible to suppress degradation of electrical characteristics due to the entrance of water into the containing space for the IDT inside the protective cover. In other words, in the first preferred embodiment, a surface acoustic wave device excellent in long-term reliability can be achieved.

<Method of Manufacturing Surface Acoustic Wave Device>

Figure 2:
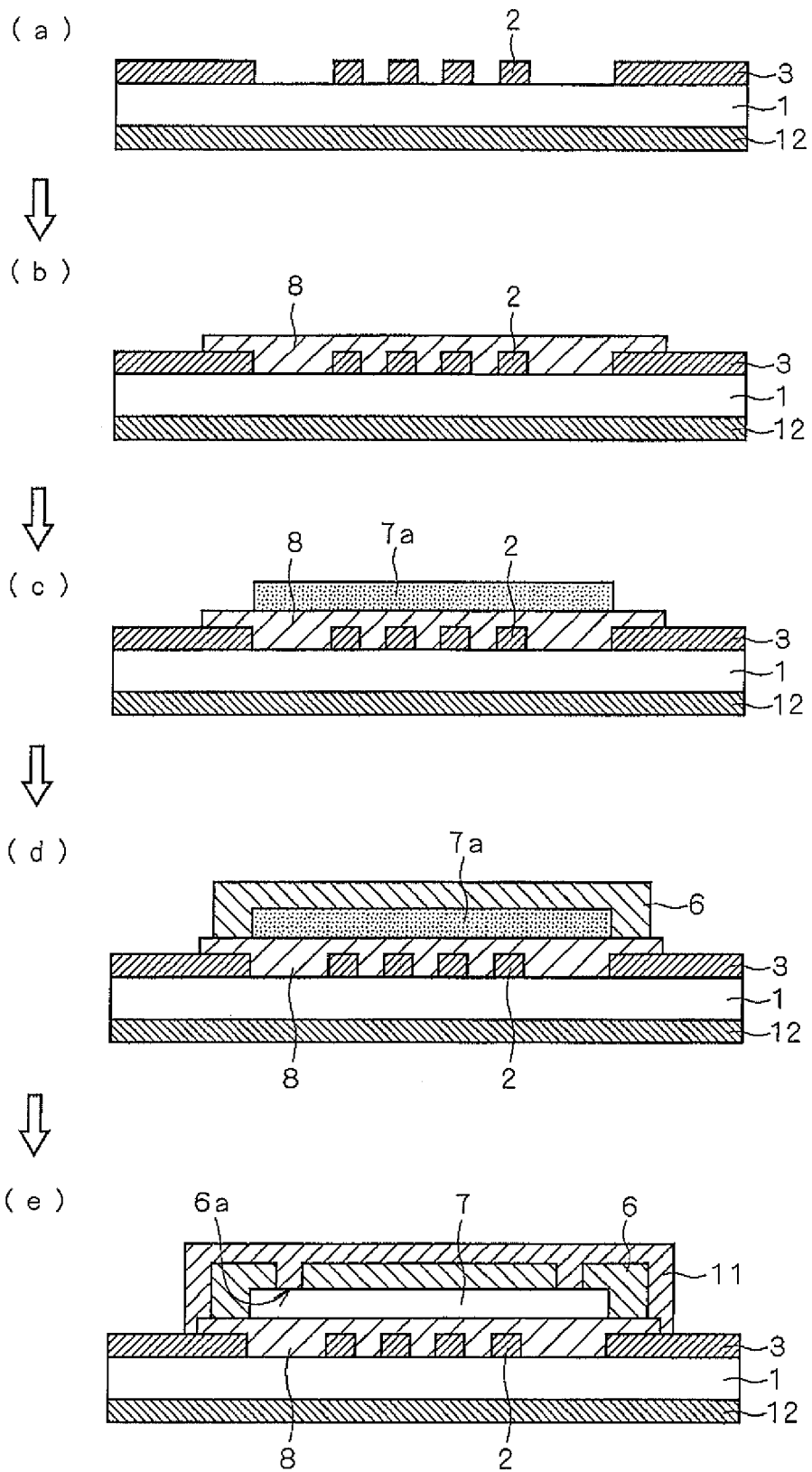
[FIG. 2] is a view schematically showing a process of manufacturing the surface acoustic wave device S1.

Next, a process of manufacturing the surface acoustic wave device S1 of the first preferred embodiment will be discussed with reference to FIG. 2. Herein, discussion will be made on the case where the bonding film 8 is so formed, extending to the region where the IDT 2 is formed, as to cover the IDT 2, as shown in FIG. 1.

First, as shown in FIG. 2(a), the IDT 2 and the connecting line 3 are formed on the piezoelectric substrate 1. Specifically, a piezoelectric single crystal substrate such as a lithium tantalate single crystal or a lithium niobate single crystal is used as the piezoelectric substrate 1, and on one main surface of the piezoelectric substrate 1, the IDT 2 and the connecting line 3 are formed of an Al alloy such as Al—Cu alloy. Formation of the IDT 2 and the connecting line 3 is achieved by executing a pattern formation step in which an Al-alloy thin film which is formed by thin film formation such as sputtering, vapor deposition or CVD (Chemical Vapor Deposition) is patterned into a desired shape by photolithography using a reduction projection aligner (stepper) and an RIE (Reactive Ion Etching) device and the like. A region on the piezoelectric substrate 1 where the IDT 2 is formed is referred to as a surface acoustic wave element region.

Subsequently, the back surface electrode 12 is formed of an Al alloy such as an Al—Cu alloy on a back surface of the piezoelectric substrate 1 by thin film formation such as sputtering, vapor deposition or CVD (Chemical Vapor Deposition).

Next, as shown in FIG. 2(b), a bonding film formation step is executed, where the bonding film 8 is formed of silicon oxide, silicon nitride or silicon. Specifically, the thin film made of silicon oxide, silicon nitride or silicon is so formed by thin film formation such as CVD or vapor deposition as to cover at least the IDT 2 and the connecting line 3, and part of the thin film is so removed by photolithography as to expose a portion of the connecting line 3 which corresponds to a connection with the external circuit, thereby forming the bonding film 8.

Next, as shown in FIG. 2(c), a sacrificial layer formation step is executed, where a sacrificial layer 7a is formed on a portion on an upper surface of the bonding film 8, which is positioned above the surface acoustic wave element region. The sacrificial layer 7a is a layer which is once formed and then removed by etching, dissolution or the like in a later step. The sacrificial layer 7a can be formed of silicon oxide such as silicon dioxide, amorphous silicon, a photoresist, one of other polymer materials or the like. Herein, discussion will be made on a case where the sacrificial layer 7a is formed of silicon dioxide.

In such a case, the sacrificial layer 7a can be formed by plasma CVD using a source gas such as TEOS (tetraethyl orthosilicate), TEB (tetraethyl borate) or TMOP (tetramethyl oxyphosphate) or by a method using a vacuum process, such as sputtering, or the like.

Alternatively, the sacrificial layer 7a can be formed by using the photosensitivity of polysilane. The polysilane is a silicon high polymer in which silicon (Si) atoms are linked in an open chain. When the silicon high polymer is irradiated with ultraviolet light, the Si—Si bond is photodecomposed to thereby generate a siloxane bond site where an oxygen atom is placed between the silicon bond or a silanol group acting as an acidic site. When this is immersed in an alkaline developing solution, a portion in which the silanol group is generated is dissolved in the developing solution. In other words, a portion exposed to the ultraviolet light is selectively formed and only the exposed portion is removed by dissolution, and this allows any planar shape to be processed. After the development, by irradiating the entire surface with the ultraviolet light of sufficient intensity again for exposure and then heating the surface in an oxygen atmosphere again, an oxygen atom enters a portion where the bond between the silicons is broken in response to the ultraviolet light and a silicon oxide film is thereby formed. Further, as a modification group modifying a side chain of polysilane, various groups, such as a propyl group, a hexyl group, a phenylmethyl group, a trifluoropropyl group, a nonafluorohexyl group, a tolyl group, a biphenyl group, a phenyl group or a cyclohexyl group, can be selected as appropriate.

Further, if the sacrificial layer 7a is formed of an amorphous silicon, the layer can be formed by plasma CVD using a source gas such as $H_2$ or $SiH_4$ or by a method using a vacuum process, such as sputtering, or the like.

After forming the sacrificial layer 7a, a protective cover formation step is executed, where the sacrificial layer 7a is covered with a negative-type photosensitive resist such as an epoxy resin, a polyimide resin, a BCB (benzocyclobutene) or an acrylic resin by a spin coat method, as shown in FIG. 2(d), and exposure and development are performed to form the protective cover 6. At that time, the acid-generating agent is contained in at least a portion of the arrangement surface 14 which is in contact with the bonding film 8. There may be a case where the whole of the protective cover 6 is formed of a photosensitive resist containing the acid-generating agent. In the case where the bonding film 8 is formed of silicon oxide, with the crosslinking reaction occurring when the photosensitive resist is photocured by exposure, the protons generated from the acid-generating agent breaks the bond of oxygen atoms of the resin material forming the protective cover 6 to cause ring opening, thereby forming a covalent bond with the Si—OH group of the bonding film 8. It is thereby possible to achieve an excellent bond not only between the piezoelectric substrate 1 and the arrangement surface 14 of the protective cover 6 but also between the bonding film 8 and the arrangement surface 14.

Further, a sacrificial layer removing step is executed, where the through hole 6a is formed in the protective cover 6 and the sacrificial layer 7a is removed through the through hole 6a, thereby forming the containing space 7 serving as a vibration space for the IDT between the protective cover 6 and the piezoelectric substrate 1, as shown in FIG. 2(e). In the first preferred embodiment, the sacrificial layer formation step of forming the sacrificial layer 7a, the protective cover formation step of forming the protective cover 6 and the sacrificial layer removing step of removing the sacrificial layer 7a correspond to a containing space formation step.

As a method of removing the sacrificial layer 7a through the through hole 6a, if the sacrificial layer 7a is formed of an amorphous silicon, a selective etching by either of dry etching or wet etching can be adopted. The sacrificial layer can be removed, for example, by dry etching using a xenon fluoride ($XeF_2$) gas, wet etching using nitrate fluoride, or the like. If the sacrificial layer 7a is formed of silicon dioxide, dry etching using vapor hydrofluoric acid, wet etching through immersion in buffer hydrofluoric acid, or the like can be used.

After the containing space 7 is formed by removing the sacrificial layer 7a, the sealing resin layer 11 is formed of an epoxy resin or the like.

Through the above process steps, the surface acoustic wave device S1 excellent in long-term reliability, as shown in FIG. 1, can be manufactured.

The Second Preferred Embodiment

<Constitution of Surface Acoustic Wave Device>

Figure 3:
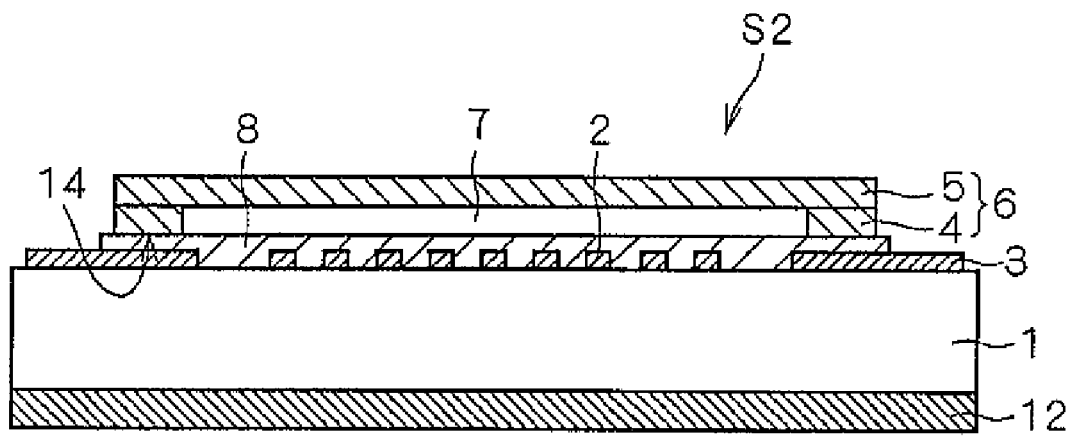
[FIG. 3] is a cross-sectional schematic view showing a surface acoustic wave device 82 in accordance with a second preferred embodiment.

FIG. 3 is a cross-sectional schematic view showing a surface acoustic wave device S2 in accordance with the second preferred embodiment of the present invention. Constituent elements in the surface acoustic wave device S2 of the second preferred embodiment which have the same action and effect as those of the constituent elements in the surface acoustic wave device Si of the first preferred embodiment are represented by the same reference signs and will not be described herein.

Also in the surface acoustic wave device S2 of the second preferred embodiment, the containing space 7 is ensured by the protective cover 6 and the connecting line 3 extends to the outside of the protective cover 6. In other words, part of the protective cover 6 is formed to straddle over the connecting line 3. The surface acoustic wave device S2 is different, however, from the surface acoustic wave device S1 of the first preferred embodiment in that the frame body 4 of the protective cover 6 and the cover body 5 thereof are individually formed. In the second preferred embodiment, specifically, the frame body 4 surrounding the formation region of the IDT 2 is formed on the piezoelectric substrate 1 and the cover body 5 is formed on an upper surface of the frame body 4, and then these elements are bonded by heating, thereby forming the protective cover 6. This manner is preferable for achieving high hermeticity of the containing space 7 and contributes to the realization of the surface acoustic wave device excellent in long-term reliability.

The frame body 4 is formed of a mixture in which an acid-generating agent is mixed into a negative-type photosensitive resist such as an epoxy resin, a polyimide resin, a BCB (benzocyclobutene) or an acrylic resin, like the protective cover 6 in the surface acoustic wave device S1 of the first preferred embodiment. In the second preferred embodiment, a lower end portion of the frame body 4 corresponds to the arrangement surface 14. Also in the second preferred embodiment, at least a portion of the arrangement surface 14 which is in contact with the bonding film 8 is formed of the above mixture in which the acid-generating agent is mixed into the photosensitive resist so that a bond good enough to ensure the hermeticity of the containing space 7 between the protective cover 6 and the connecting line 3 can be achieved.

The cover body 5 is formed of a resist such as an epoxy resin, a polyimide resin, a BCB (benzocyclobutene) or an acrylic resin. Preferably, the cover body 5 is formed of a film-like member (film member) of the resist. In such a case, only by pasting the film, the cover body 5 having a uniform thickness can be formed.

Alternatively, the frame body 4 may be formed of a film member. In such a case, since the frame body 4 has a uniform thickness, the cover body 5 can be formed on the frame body 4 without any clearance. In the case where the frame body 4 is formed of a film member, from the viewpoint that the frame body 4 is downsized and made low-profile while ensuring its own weight, it is preferable that its thickness should be about 30 μm.

More preferably, the frame body 4 and the cover body 5 are formed of the same material. In such a case, there is no bonding interface between these elements in the protective cover 6 after the thermal bonding, and the protective cover 6 has a structure in which these elements are substantially united can be formed. In this case, since sufficient bonding strength is ensured between the frame body 4 and the cover body 5, the protective cover 6 excellent in hermeticity can be achieved.

Though not shown in FIG. 3, the sealing resin layer 11 may be so formed as to cover the protective cover 6 also in the surface acoustic wave device S2.

Figure 4:
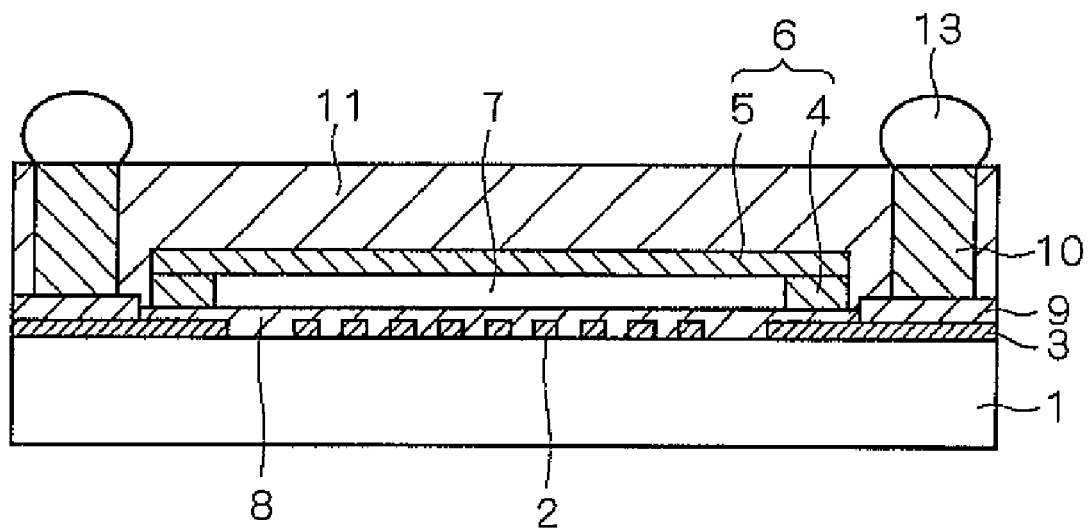
[FIG. 4] is a view schematically showing a construction of the surface acoustic wave device S2 in which a sealing resin layer 11 is formed and an external electrode is also provided.

FIG. 4 is a view schematically showing a construction of the surface acoustic wave device S2 in which the sealing resin layer 11 is formed and the external electrode is also provided.

As shown in FIG. 4, in the surface acoustic wave device S2, on the portion of the connecting line 3 which is exposed outside in FIG. 3, an electrode formation underlying layer 9 is formed and then an external connection electrode consisting of a column-like portion 10 and an electrode terminal portion 13 is formed thereon. Further, the sealing resin layer 11 is so formed as to bury the protective cover 6 and the column-like portion 10 therein.

The column-like portion 10 is formed by electroplating or chemical plating of a predetermined metal material. The electrode formation underlying layer 9 is provided as an underlying layer for depositing a metal which is a material for the column-like portion 10 thereon in the plating. For this reason, it is preferable that the electrode formation underlying layer 9 and the column-like portion 10 should be formed of the same material. As one preferable case, the column-like portion 10 and the electrode formation underlying layer 9 are formed of copper (Cu). From the consideration of the adhesion with the Al—cu alloy forming the connecting line 3, it is more preferable to further interpose a not-shown adhesion layer formed of Cr, Ti or the like between the connecting line 3 and the electrode formation underlying layer 9. If the column-like portion 10 is formed by electroplating, it is preferable that the thickness of the electrode formation underlying layer 9 should be 100 nm or more. When the electrode formation underlying layer 9 has such a thickness, a current can be stably carried in the formation of the column-like portion 10.

Since the column-like portion 10 is formed on the electrode formation underlying layer 9, however, it is not necessary to make the electrode formation underlying layer 9 itself thicker than necessary and the electrode formation underlying layer 9 only has to have a thickness of at most, about several hundreds nm.

Further, by disposing the external connection electrode in vicinity of a heating portion of the IDT 2, it is possible to increase thermal radiation of the surface acoustic wave device. If a duplexer is manufactured as the surface acoustic wave device S2 of the second preferred embodiment, the column-like portion 10 of the external connection electrode can favorably function as an electrode for thermal radiation. Depending on the used frequency or the manner of connection of the IDTs 2 if there are a plurality of IDTs, the heating portion of the IDT 2 is near the center of the IDT 2 if it is a resonator. By contriving the arrangement, the number and the diameter of the column-like portion 10 in accordance with the constitution of the surface acoustic wave device S2, it is possible to increase the thermal radiation.

The electrode terminal portion 13 serves as a connection terminal for connection with the external circuit in surface mounting of the surface acoustic wave device S2. The electrode terminal portion 13 is provided at an end portion (an upper end portion in the case of FIG. 4) of the column-like portion 10. Specifically, the IDT 2 and the electrode terminal portion 13 are connected to each other with the connecting line 3 and the column-like portion 10. The electrode terminal portion 13 may be achieved by formation of a solder bump using PbSn solder, leadless solder, AuSn solder, AuGe solder or the like, or may be achieved by formation of a flat pad using a thin film made of a conductive material. Further, in the second preferred embodiment, the material for the electrode terminal portion 13 can be selected in accordance with a printed circuit board on which the surface acoustic wave device is mounted. This makes it possible to realize a surface acoustic wave device with high reliability of the bonding with the printed circuit board.

The sealing resin layer 11 is formed of an epoxy resin or one of the other materials having low modulus of elasticity, like in the first preferred embodiment. By providing the sealing resin layer 11, the containing space 7 is surely sealed. The sealing resin layer 11 also has a function to protect the column-like portion 10 and prevent breakage of the column-like portion 10. Further, in the second preferred embodiment, as discussed later, the sealing resin layer 11 is formed after the column-like portion 10 is formed and then the electrode terminal portion 13 is formed.

Also in the surface acoustic wave device S1 of the first preferred embodiment, there may be a construction where the sealing resin layer 11 is formed after the column-like portion 10 is formed and then the electrode terminal portion 13 is formed.

As discussed above, also in the surface acoustic wave device of the second preferred embodiment, with the above-discussed construction, it is possible to suppress degradation of electrical characteristics due to the entrance of water and the like into the containing space for the IDT inside the protective cover. In other words, in the second preferred embodiment, a surface acoustic wave device excellent in long-term reliability can be achieved.

<Method of Manufacturing Surface Acoustic Wave Device>

Figure 5:
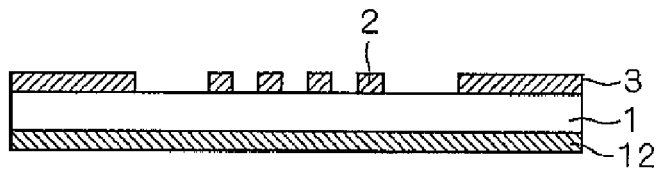
[FIG. 5] is a view schematically showing a process of manufacturing the surface acoustic wave device S2.
Figure 5:
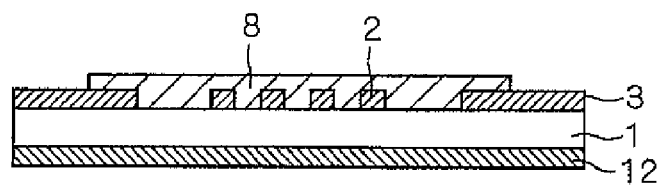
Figure 5:
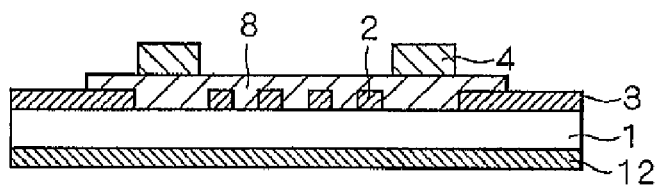
Figure 5:
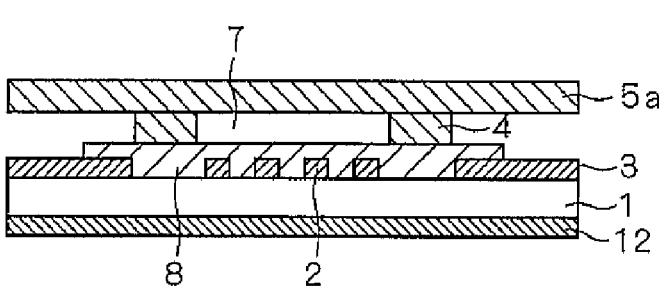
Figure 5:
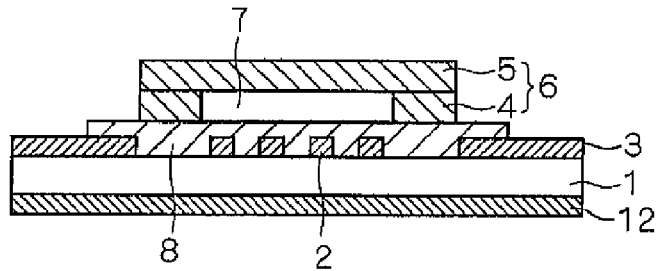
Figure 6:
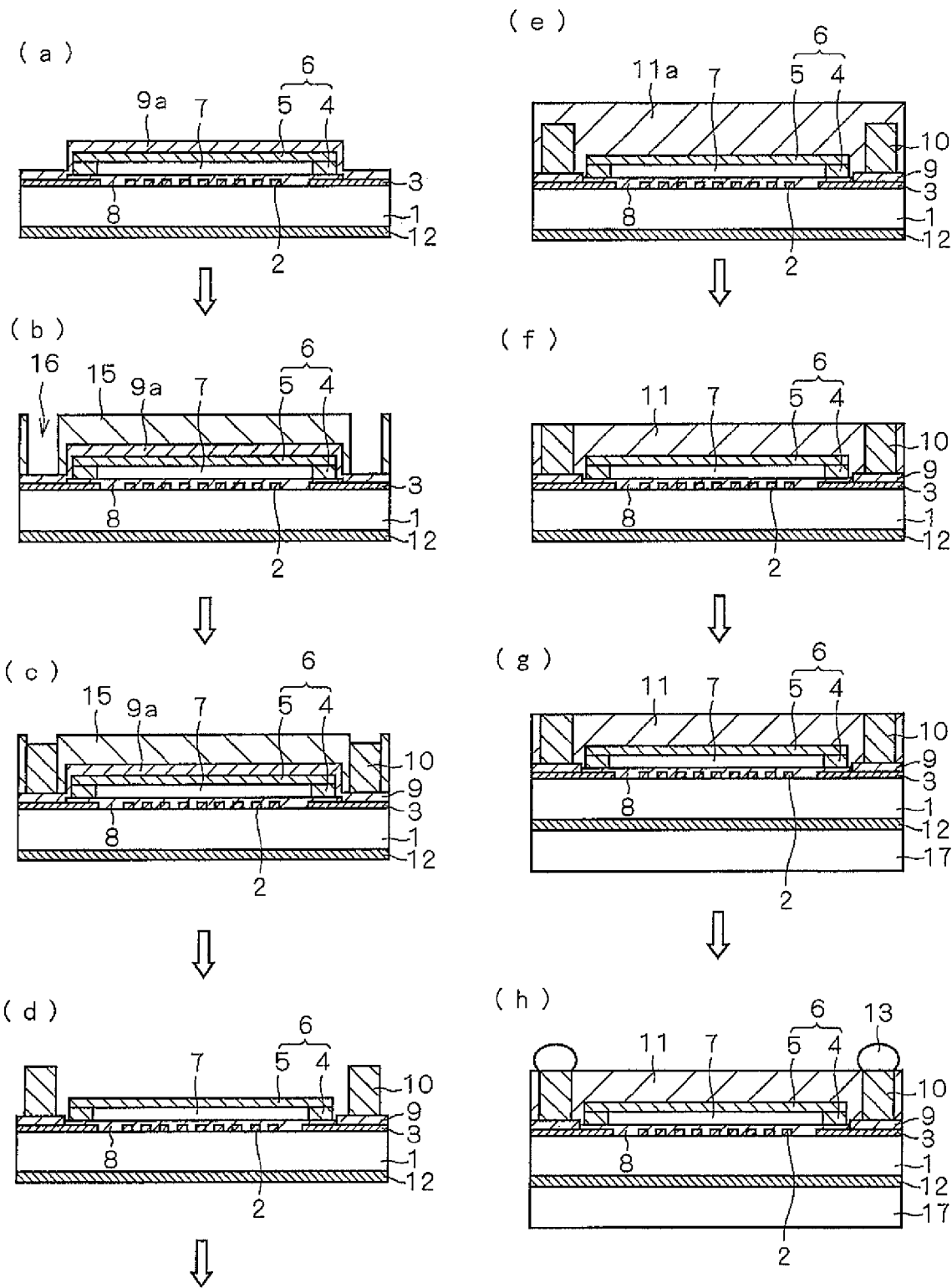
[FIG. 6] is a view schematically showing a process of manufacturing the surface acoustic wave device S2.

Next, a process of manufacturing the surface acoustic wave device S2 of the second preferred embodiment will be discussed with reference to FIGS. 5 and 6. Herein, discussion will be made on the case where the bonding film 8 is so formed, extending to the region where the IDT 2 is formed, as to cover the IDT 2, as shown in FIG. 3.

First, as shown in FIG. 5(a), the IDT 2 and the connecting line 3 are formed on the piezoelectric substrate 1, like in the first preferred embodiment. Specifically, for example a piezoelectric single crystal substrate such as a lithium tantalate single crystal or a lithium niobate single crystal is used as the piezoelectric substrate 1, and on one main surface of the piezoelectric substrate 1, the IDT 2 and the connecting line 3 are formed of an Al alloy such as Al—Cu alloy. Formation of the IDT 2 and the connecting line 3 is achieved by executing the pattern formation step in which an Al-alloy thin film which is formed by thin film formation such as sputtering, vapor deposition or CVD (Chemical Vapor Deposition) is patterned into a desired shape by photolithography using a reduction projection aligner (stepper) and an RIE (Reactive Ion Etching) device and the like. A region on the piezoelectric substrate 1 where the IDT 2 is formed is referred to as a surface acoustic wave element region.

Subsequently, the back surface electrode 12 is formed of an Al alloy such as an Al—Cu alloy on the back surface of the piezoelectric substrate 1 by thin film formation such as sputtering, vapor deposition or CVD (Chemical Vapor Deposition).

Next, as shown in FIG. 5(b), the bonding film formation step is executed, where the bonding film 8 is formed of silicon oxide, silicon nitride or silicon. Specifically, the thin film made of silicon oxide, silicon nitride or silicon is so formed by thin film formation such as CVD or vapor deposition as to cover at least the IDT 2 and the connecting line 3, and part of the thin film is so removed by photolithography as to crop out a portion of the connecting line 3 which corresponds to a connection with the external circuit, thereby forming the bonding film 8.

Next, as shown in FIG. 5(c), a frame portion formation step is executed, where a negative-type photosensitive resist is so applied onto the piezoelectric substrate 1 by a printing method or the like as to surround the region where the IDT 2 has been formed and exposure and development are performed thereon, to thereby form the frame body 4. Further, there may be a method where the film member is pasted on the piezoelectric substrate 1 by using a pasting machine while being pressed and then exposure and development are performed thereon, to thereby form the frame body 4. At that time, the acid-generating agent is contained in at least a portion of the arrangement surface 14 which is in contact with the bonding film 8. There may be a case where the whole of the frame body 4 is formed of a photosensitive resist containing the acid-generating agent. As the negative-type photosensitive resist, the same one as used in the first preferred embodiment to form the protective cover 6 can be used.

Next, as shown in FIG. 5(d), a cover portion formation step is executed where a film member 5a for forming the cover body 5 is pasted on an upper surface of the frame body 4 by using the pasting machine and then a bonding step is executed where these elements are bonded by heating. The condition for heating is determined as appropriate in accordance with the materials for these elements. If an epoxy resin is used as the material for the frame body 4 and the cover body 5, it is preferable that the thermal bonding should be performed at a temperature in a range from 100° C. to 200° C. since polymerization of the epoxy resin is accelerated and the bonding strength and the hermeticity thereby increase.

After that, by removing an unnecessary portion of the film member 5a (a portion extending of to the outside of the frame body 4), as shown in FIG. 5(e), formed is the protective cover 6 having the structure in which the frame body 4 and the cover body 5 are bonded. In the second preferred embodiment, the frame portion formation step of forming the frame body 4, the cover body formation step of forming the cover body 5 and the bonding step of bonding these elements correspond to the containing space formation step.

Further, by forming the protective cover 6, formed is the containing space 7 serving as a vibration space for the IDT 2 between the protective cover 6 and the piezoelectric substrate 1. Specifically, in the second preferred embodiment, since the surface acoustic wave device is manufactured through the process where the frame body 4 and the cover body 5 are sequentially formed, thereby forming the protective cover 6, the process for achieving the containing space 7 in the manufacturing method of the first preferred embodiment is not needed, where the sacrificial layer 7a is once formed and then the through hole 6a is formed, to be used for removing the sacrificial layer 7a. In the manufacturing method of the second preferred embodiment, since less residues are left in the containing space 7, it is possible to suppress degradation of electrical characteristics of the surface acoustic wave device due to the presence of such residues. Therefore, the manufacturing method of the second preferred embodiment in which the protective cover 6 and the containing space 7 are formed by the above-discussed process is more advantaged in terms of the manufacture of the surface acoustic wave device with higher reliability.

After the containing space 7 is formed through formation of the protective cover 6, an electrode formation step of forming the external connection electrode and a sealing step of performing resin sealing are executed.

First, as shown in FIG. 6(a), a plating underlying layer 9a for covering the entire upper surface of the piezoelectric substrate 1 is formed. The plating underlying layer 9a is a metal layer, part of which is used as the electrode formation underlying layer 9 in a later step. As one preferable case, the plating underlying layer 9a is formed of a Ti—Cu alloy or the like by e.g., flash plating. If the plating underlying layer 9a is formed by flash plating, it is not necessary to form a wiring pattern for carrying a current to a plated portion. This contributes to size reduction of the surface acoustic wave device.

In the case where the plating underlying layer 9a is formed on the entire upper surface of the piezoelectric substrate 1 including the protective cover 6, the plating underlying layer 9a only has to be formed to such a degree as to ensure the formation of the column-like portion 10 of the external connection electrode thereon in at least a portion to become the electrode formation underlying layer 9. Therefore, even if, for example, a side surface portion of the protective cover 6 has a large step, where a non-formation portion of the plating underlying layer 9a appears, and this inhibits conduction between the upper surface (of the cover body 5) of the protective cover 6 and the portion to become the electrode formation underlying layer 9, it is not practically a great problem. For a state where conduction is entirely achieved, specifically, there arises no problem if the height of the step is half or less of the thickness of the plating underlying layer 9a to be formed. If the step has a height of 0.35 μm or less, the plating underlying layer 9a has only to have a thickness of 0.7 μ.

After the plating underlying layer 9a is achieved, a plating resist layer 15 is formed on the plating underlying layer 9a. The plating resist layer 15 is so formed as to have an opening 16 through which the plating underlying layer 9a is cropped out in a portion (to become the electrode formation underlying layer 9) above the connecting line 3 positioned outside the protective cover 6, as shown in FIG. 6(b). This cropped out portion is used as the electrode formation underlying layer 9 in a later step.

The plating resist layer 15 is formed on the plating underlying layer 9a by e.g., a spin coat method or the like. Further, by controlling the viscosity of the resist material to be used and the number of applications by spin coating, the thickness of the plating resist layer 15 can be determined as appropriate in a range from several μm to several hundreds μm. The thickness of the plating resist layer 15 may be determined in accordance with the height of the column-like portion 10 to be formed in a later step.

For formation of the plating resist layer 15, it is preferable that after a resist material is once applied up to the same level as the upper surface of the protective cover 6 and hardened to fill a large step of the protective cover 6, thereby achieving a flat surface, application and hardening of the resist material should be further repeated. In such a case, the plating resist layer 15 having a flat upper surface can be achieved.

The opening 16 can be formed favorably by a general photolithography method. After the opening 16 is formed, as shown in FIG. 6(c), the column-like portion 10 is formed on the electrode formation underlying layer 9 in the opening 16.

Though the column-like portion 10 can be formed by electroplating, electroless plating, stud bumping or the like, it is preferable to form the column-like portion 10 by electroplating. Since the electroplating is a method which ensures high rate of growth and easy thick film formation, it increases the degree of freedom in the height of the column-like portion 10. Further, the electroplating ensures good adhesion between the formed column-like portion 10 and the plating underlying layer 9a. Especially, since the thickness of plating depends on the plating time, if it is intended to form a thickness of 30 μm or more, it is preferable to use electroplating which ensures high rate of growth. As the material for formation of the column-like portion 10, e.g., Cu, Au, Ni or the like may be used. If Cu or solder is used, especially, it is preferably possible to cut the material cost.

The column-like portion 10 is formed so that its upper surface may be positioned higher than the upper surface of the protective cover 6. This is because the upper surface of the column-like portion 10 is made to be cropped out with the protective cover 6 covered with the sealing resin layer 11, in removing an upper portion of a resin layer 11a in a later step. The heights of the protective cover 6 and the column-like portion 10 are heights from the upper surface of the piezoelectric substrate 1. If this relation is satisfied, since there is no case where the upper surface (of the cover body 5) of the protective cover 6 is cropped out or ground even if the resin layer 11a is ground as discussed later, it is possible to reliably ensure hermeticity of the protective cover 6.

After the column-like portion 10 is formed, as shown in FIG. 6(d), by removing the plating resist layer 15 and a portion of the plating underlying layer 9a which is formed below the plating resist layer 15 (a portion other than the electrode formation underlying layer 9), the column-like portion 10 is cropped out.

The plating resist layer 15 is removed by using an organic solvent such as acetone or IPA, or using an alkali-organic solvent such as dimethyl sulfoxide. If the plating underlying layer 9a is formed of Cu, the plating underlying layer 9a is removed by using a mixed solution of ferric chloride or phosphoric acid and oxygenated water. If the plating underlying layer 9a is formed of Ti, the plating underlying layer 9a is removed by using a mixed solution of dilute hydrofluoric acid or ammonia and oxygenated water. From the viewpoint of suppressing damage to the bonding film 8 made of $SiO_2$ or the like and the connecting line 3 made of an Al—Cu alloy or the like which are formed below the plating underlying layer 9a, it is preferable to use the mixed solution of ammonia and oxygenated water.

Further, when the plating underlying layer 9a is removed after the column-like portion 10 is cropped out by removing the plating resist layer 15 as discussed above, part of an outer edge portion of the electrode formation underlying layer 9 positioned below the column-like portion 10 is removed but the other portion is left. In other words, the column-like portion 10 is not removed when the plating underlying layer 9a is removed.

After the column-like portion 10 is cropped out, as shown in FIG. 6(e), the resin layer 11a is so formed as to cover the entire upper surface of the piezoelectric substrate 1 including the protective cover 6 and the column-like portion 10. The resin layer 11a is a layer, part of which is used as the sealing resin layer 11. Therefore, the resin layer 11a is formed of a material for the sealing resin layer 11. Specifically, the resin layer 11a is formed of an epoxy resin or one of the other materials having low modulus of elasticity. If air bubbles are mixed into the sealing resin layer 11, it becomes impossible to stably seal a structure including the protective cover 6, and therefore, it is also preferable that the resin layer 11a should be printed by vacuum printing.

After the resin layer 11a is achieved, its upper surface portion is ground and the column-like portion 10 is thereby cropped out, as shown in FIG. 6(f). The portion which is left without being ground in this step becomes the sealing resin layer 11.

Specifically, a grinder is used and the upper surface of the resin layer 11a is ground by a grinding blade until the column-like portion 10 is cropped out. After that, for good connection between the electrode terminal portion 13 and the column-like portion 10 discussed later, a finishing process may be performed by buffing or the like.

Preferably, at the point of time when the sealing resin layer 11 is achieved, a protective layer 17 is subsequently formed as shown in FIG. 6(g).

The protective layer 17 is provided for the purpose of increasing impact resistance of the surface acoustic wave device S1 during and after manufacture. In other words, provision of the protective layer 17 suppresses occurrence of defects such as breakage or chip in the surface acoustic wave device and realizes an increase in manufacturing yield and reliability.

If the protective layer 17 is formed in a range from the lower surface of the piezoelectric substrate 1 to a side surface thereof, a structure for protecting not only the lower surface but also the side surface of the piezoelectric substrate 1 is achieved. In such a case, since it is possible to suppress entrance of water from the interface between the piezoelectric substrate 1 and the sealing resin layer 11, a surface acoustic wave device with further increased hermeticity and moisture resistance can be achieved.

It is preferable that the protective layer 17 should be formed of a material having almost the same thermal expansion coefficient as that of the sealing resin layer 11. In such a case, since a stress given by the sealing resin layer 11, which is caused if only the sealing resin layer 11 is provided, is relieved, it is possible to suppress a warp of the piezoelectric substrate 1 due to the stress. This realizes a surface acoustic wave device with higher reliability. If an epoxy resin material is used, especially, it is preferably possible to control the thermal expansion coefficient with a filler such as $SiO_2$ added, to cancel out the stress to be imposed on the piezoelectric substrate 1 in its upper and lower surfaces with low permeability and high water absorption and to suppress entrance of water into the surface acoustic wave device.

Though the protective layer 17 may be formed at any timing after the back surface electrode 12 is formed, it is preferable that the protective layer 17 should be formed after the sealing resin layer 11 is formed on the upper surface of the piezoelectric substrate 1, as discussed above, since the stress to be imposed on the piezoelectric substrate 1 can be cancelled out with the difference in the thermal expansion coefficient between the piezoelectric substrate 1 and the sealing resin layer 11 and this realizes a surface acoustic wave device with higher reliability.

Next, the electrode terminal portion 13 is formed on the cropped out upper surface of the column-like portion 10. The electrode terminal portion 13 may be formed as a solder bump as shown in FIG. 6(h) or formed as a flat pad by forming a thin film of a conductive material. In the former case, the electrode terminal portion 13 can be formed by screen printing of cream solder made of e.g., PbSn solder, leadless solder, AuSn solder, AuGe solder or the like on an upper portion of the column-like portion 10 and reflow.

The surface acoustic wave device of the second preferred embodiment is manufactured through the above-discussed process steps. These process steps can be executed in a so-called wafer process, and the above process can be performed concurrently for a lot of surface acoustic wave devices, by targeting a motherboard which is to become the piezoelectric substrates 1 by dividing. In other words, without being subjected to complicated processings in a post process, the surface acoustic wave device can be achieved.

Further, since the containing space serving as a vibration space for the IDT can be formed without using the sacrificial layer, the process steps needed to form and remove the sacrificial layer are not needed, and this reduces the number of steps for forming the vibration space and increases productivity. Furthermore, provision of the protective cover on the piezoelectric substrate 1 eliminates the need for a ceramic package or the like for containing the surface acoustic wave device, and this makes it possible to provide a downsized surface acoustic wave device.

Variation of The First and Second Preferred Embodiments

Next, a variation of the first and second preferred embodiments will be discussed with reference to FIG. 7. The B-B cross section shown in FIG. 7(b) substantially corresponds to the cross section shown in FIG. 8(a). Though a surface acoustic wave device S3 is shown in FIG. 7 as a variation of the surface acoustic wave device Si of the first preferred embodiment, this variation can be also applied to the surface acoustic wave device S2 of the second preferred embodiment.

Though the case where the end portion of the connecting line 3 is positioned outside the protective cover 6 (specifically, as one example, the case where the connecting line 3 reaches the side end of the piezoelectric substrate 1) has been discussed in the first and second preferred embodiments, in this variation, as shown in FIG. 7, the end portion of the connecting line 3 has a rectangular shape in a plan view and is positioned below the frame portion of the protective cover 6. Further, the bonding film 8 is so formed as to cover only an upper surface and an outer peripheral portion of the end portion of the connecting line 3. Specifically, the bonding film 8 is so formed as to have an opening 8b in a center region of the connecting line 3. The frame portion of the protective cover 6 is provided with a through hole 6a communicating with the opening. By filling the opening 8b and the through hole 6a with a metal material, the column-like portion 10 of the external connection electrode which is connected to the end portion of the connecting line 3 is formed. Further, the electrode terminal portion 13 is provided at an upper end portion of the column-like portion 10. The sealing resin layer 11 is so formed as to cover the protective cover 6 and seal the through hole 6a.

Though the sealing resin layer 11 supports the column-like portion 10 in the surface acoustic wave device S2 of FIG. 4, in the variation of FIG. 7, since the column-like portion 10 is supported by the frame portion of the protective cover 6, the sealing resin layer 11 may be formed only at such a portion as to close the through hole 6a.

The invention claimed is:

1. A surface acoustic wave device comprising:
   a piezoelectric substrate configured to propagate an surface acoustic wave thereon;
   an IDT formed on a first main surface of the piezoelectric substrate and comprising at least one comb-like electrode having a plurality of electrode fingers, wherein a longitudinal direction of each electrode finger is substantially orthogonal to a propagating direction of the surface acoustic wave;
   a protective cover comprising a photocurable material and configured to cover a formation region of the IDT so as to form a hollow containing space together with the first main surface, wherein the protective cover has an acid generating portion comprising an acid-generating agent at a lower end thereof;
   a connecting line formed on the first main surface and connected to the IDT, wherein an end portion of the connecting line is located outside of the protective cover; and
   a bonding film comprising an insulating material and interposed between the acid generating portion of the protective cover and the connecting line.

2. The surface acoustic wave device according to claim 1, wherein
   the protective cover comprises a frame body surrounding the IDT and a film-like cover body which is placed on the frame body and is bonded to the frame body.

3. The surface acoustic wave device according to claim 1, further comprising
   a protection film configured to bury the IDT therein.

4. The surface acoustic wave device according to claim 1, wherein
   the bonding film comprising an extended portion which is configured to bury the IDT therein.

5. The surface acoustic wave device according to claim 1, wherein
   an outer peripheral edge of the bonding film is positioned more outer than an outer peripheral edge of the frame portion.

6. The surface acoustic wave device according to claim 1, wherein
   a substantially column-like external connection electrode is provided on the end portion of the connecting line, and the protective cover and the external connection electrode are resin-sealed with an upper end portion of the external connection electrode cropped out.

7. A method of manufacturing a surface acoustic wave device, comprising:
   forming an IDT on a first main surface of the piezoelectric substrate, wherein the IDT comprises at least one comb-like electrode comprising a plurality of electrode fingers each having a longitudinal direction orthogonal to a propagating direction of an surface acoustic wave on a piezoelectric substrate;
   forming a connecting line connected to the IDT and an external circuit on a first main surface of the piezoelectric substrate;
   forming a bonding film comprising an insulating material on the connecting line;
   covering a formation region of the IDT by a protective cover, wherein the protective cover comprises a photocurable material and an acid generating portion containing an acid-generating agent in its lower end region which is in contact with the bonding film; and
   forming a hollow containing space surrounded by the first main surface and an inner surface of the protective cover.

8. The method of manufacturing a surface acoustic wave device according to claim 7, wherein
   the containing space formation step comprises
      forming a sacrificial layer which fills a space to become the containing space;
      forming the protective cover which covers the sacrificial layer
      forming a through hole in the protective cover; and
      removing the sacrificial layer through the through hole.

9. The method of manufacturing a surface acoustic wave device according to claim 7, wherein
   the containing space formation step comprises:
      forming a frame portion by placing a frame body surrounding the IDT on the first main surface;
      forming a cover portion by placing a film-like cover body on the frame body;
      bonding the frame body and the cover body to form the protective cover.

10. The method of manufacturing a surface acoustic wave device according to claim 7, wherein
    the bonding film formation step comprises burying the IDT in the bonding film.

11. The method of manufacturing a surface acoustic wave device according to claim 7, further comprising:
    providing a substantially column-like external connection electrode on the end portion of the connecting line; and
    resin-sealing the protective cover and the external connection electrode with an upper end portion of the external connection electrode cropped out.

* * * * *